US008367495B2

(12) United States Patent
Beyer et al.

(10) Patent No.: US 8,367,495 B2
(45) Date of Patent: Feb. 5, 2013

(54) METHOD FOR FORMING CMOS TRANSISTORS HAVING METAL-CONTAINING GATE ELECTRODES FORMED ON A HIGH-K GATE DIELECTRIC MATERIAL

(75) Inventors: Sven Beyer, Dresden (DE); Markus Lenski, Dresden (DE); Richard Carter, Dresden (DE); Klaus Hempel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 320 days.

(21) Appl. No.: 12/749,112

(22) Filed: Mar. 29, 2010

(65) Prior Publication Data
US 2010/0244141 A1 Sep. 30, 2010

(30) Foreign Application Priority Data

Mar. 31, 2009 (DE) .......................... 10 2009 015 747

(51) Int. Cl.
*H01L 21/8238* (2006.01)
(52) U.S. Cl. ........ 438/216; 438/275; 438/591; 438/592; 438/E21.611
(58) Field of Classification Search ............... 438/216, 438/275, 591, 592; 257/E21.611
See application file for complete search history.

(56) References Cited

U.S. PATENT DOCUMENTS

| 7,651,935 B2* | 1/2010 | Adetutu et al. | 438/585 |
|---|---|---|---|
| 8,198,192 B2* | 6/2012 | Carter et al. | 438/623 |
| 2007/0054446 A1 | 3/2007 | Chambers et al. | 438/197 |
| 2008/0048270 A1 | 2/2008 | Adetutu et al. | 257/368 |
| 2008/0093682 A1 | 4/2008 | Yao et al. | 257/413 |
| 2010/0301427 A1* | 12/2010 | Lenski et al. | 257/392 |
| 2011/0049642 A1* | 3/2011 | Scheiper et al. | 257/392 |
| 2011/0127613 A1* | 6/2011 | Beyer et al. | 257/369 |
| 2011/0156153 A1* | 6/2011 | Beyer et al. | 257/369 |

OTHER PUBLICATIONS

Translation of Official Communication from German Patent Office for German Patent Application No. 10 2009 015 747.6 dated Feb. 17, 2010.

* cited by examiner

*Primary Examiner* — Anh Mai
(74) *Attorney, Agent, or Firm* — Williams, Morgan & Amerson, P.C.

(57) ABSTRACT

During the formation of sophisticated gate electrode structures, a replacement gate approach may be applied in which plasma assisted etch processes may be avoided. To this end, one of the gate electrode structures may receive an intermediate etch stop liner, which may allow the replacement of the placeholder material and the adjustment of the work function in a later manufacturing stage. The intermediate etch stop liner may not negatively affect the gate patterning sequence.

20 Claims, 7 Drawing Sheets

METHOD FOR FORMING CMOS TRANSISTORS HAVING METAL-CONTAINING GATE ELECTRODES FORMED ON A HIGH-K GATE DIELECTRIC MATERIAL

BACKGROUND OF THE INVENTION

1. Field of the Invention

Generally, the present disclosure relates to the fabrication of sophisticated integrated circuits including transistor elements comprising highly capacitive gate structures on the basis of a high-k gate dielectric of increased permittivity compared to conventional gate dielectrics, such as silicon dioxide and silicon nitride.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, CMOS technology is currently one of the most promising approaches due to the superior characteristics in view of operating speed and/or power consumption and/or cost efficiency. During the fabrication of complex integrated circuits using, for instance, CMOS technology, millions of transistors, e.g., N-channel transistors and P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions.

In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity, is a dominant design criterion for accomplishing an increase in the operating speed of the integrated circuits.

Presently, the vast majority of integrated circuits are based on silicon, due to substantially unlimited availability, the well-understood characteristics of silicon and related materials and processes and the experience gathered during the last 50 years. Therefore, silicon will likely remain the material of choice for future circuit generations designed for mass products. One reason for the dominant importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a gate insulation layer that separates the gate electrode, frequently comprised of polysilicon or other metal-containing materials, from the silicon channel region. In steadily improving device performance of field effect transistors, the length of the channel region has continuously been decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a dependence of the threshold voltage on the channel length. Aggressively scaled transistor devices with a relatively low supply voltage and thus reduced threshold voltage may suffer from an exponential increase of the leakage current while also requiring enhanced capacitive coupling of the gate electrode to the channel region. Thus, the thickness of the silicon dioxide layer has to be correspondingly decreased to provide the required capacitance between the gate and the channel region. For example, a channel length of approximately 0.08 µm may require a gate dielectric made of silicon dioxide as thin as approximately 1.2 nm. Although, generally, usage of high speed transistor elements having an extremely short channel may be substantially restricted to high speed signal paths, whereas transistor elements with a longer channel may be used for less critical signal paths, such as storage transistor elements, the relatively high leakage current caused by direct tunneling of charge carriers through an ultra-thin silicon dioxide gate insulation layer may reach values for an oxide thickness in the range or 1-2 nm that may not be compatible with thermal design power requirements for performance driven circuits.

Therefore, replacing silicon dioxide based dielectrics as the material for gate insulation layers has been considered, particularly for extremely thin silicon dioxide based gate layers. Possible alternative materials include materials that exhibit a significantly higher permittivity so that a physically greater thickness of a correspondingly formed gate insulation layer provides a capacitive coupling that would be obtained by an extremely thin silicon dioxide layer.

It has thus been suggested to replace silicon dioxide with high permittivity materials such as tantalum oxide ($Ta_2O_5$), with a k of approximately 25, strontium titanium oxide ($SrTiO_3$), having a k of approximately 150, hafnium oxide ($HfO_2$), HfSiO, zirconium oxide ($ZrO_2$) and the like.

Additionally, transistor performance may be increased by providing an appropriate conductive material for the gate electrode to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance based on the same thickness as a silicon dioxide based layer, while additionally maintaining leakage currents at an acceptable level. On the other hand, the non-polysilicon material, such as titanium nitride and the like, in combination with other metals, may be formed so as to connect to the high dielectric material, thereby substantially avoiding the presence of a depletion zone. Since, typically, a low threshold voltage of the transistor, which represents the voltage at which a conductive channel forms in the channel region, is desired to obtain the high drive currents, commonly, the controllability of the respective channel requires pronounced lateral dopant profiles and dopant gradients, at least in the vicinity of the PN junctions. Since the threshold voltage of the transistors is significantly determined by the work function of the metal-containing gate material, an appropriate adjustment of the effective work function with respect to the conductivity type of the transistor under consideration has to be guaranteed.

Providing different metal species for adjusting the work function of the gate electrode structures for P-channel transistors and N-channel transistors at an early manufacturing stage may, however, be associated with a plurality of difficulties, which may stem from the fact that a complex patterning sequence may be required during the formation of the sophisticated high-k metal gate stack, which may result in a significant variability of the resulting work function and thus threshold of the completed transistor structures. For instance, during a corresponding manufacturing sequence, the high-k material may be exposed to oxygen, which may result in an increase of layer thickness and thus a reduction of the capacitive coupling. Moreover, a shift of the work function may be observed when forming appropriate work function metals in an early manufacturing stage, which is believed to be caused by a moderately high oxygen affinity of the metal species, in particular during high temperature processes which may typically be required for completing the transistor structures, for instance for forming drain and source regions and the like. For this reason, in some approaches, the initial gate electrode stack may be provided with a high degree of compatibility with conventional polysilicon-based process strategies and the actual electrode metal, and the final adjustment of the work function of at least one transistor type may be accomplished in a very advanced manufacturing stage, i.e., after completing the basic transistor structure. In a corresponding replacement gate approach, the high-k dielectric material may be formed and may be covered by an appropriate metal-containing material, such as titanium nitride and the like, followed by a standard polysilicon or amorphous silicon material, which may then be patterned on the basis of well-established advanced lithography and etch techniques. Consequently, during the process sequence for patterning the gate electrode structure, the sensitive high-k dielectric material may be protected by the metal-containing material, possibly in combination with sophisticated sidewall spacer structures, thereby substantially avoiding any undue material modification during the further processing. After patterning the gate electrode structure, conventional and well-established process techniques for forming the drain and source regions having the desired complex dopant profile are typically performed. After any high temperature processes, the further processing may be continued, for instance by forming a metal silicide, if required, followed by the deposition of an interlayer dielectric material, such as silicon nitride in combination with silicon dioxide and the like. In this manufacturing stage, a top surface of the gate electrode structures embedded in the interlayer dielectric material may be exposed, for instance by etch techniques, chemical mechanical polishing (CMP) and the like. Moreover, by using an appropriate masking regime, the polysilicon material may be removed and may be replaced by an appropriate metal in order to adjust the work function for one type of transistor, which may include appropriate anneal techniques and the like, depending on the metal species under consideration and the desired work function. In other cases, the polysilicon material may be removed in both types of gate electrode structures in a common etch process and thereafter an appropriate masking regime may be applied in order to selectively fill in an appropriate metal, which may be accomplished by filling in the first metal species and selectively removing the metal species from one of the gate electrode structures. Thereafter, a further metal material may be deposited, thereby obtaining the desired work function for each type of transistor. Although, in general, this approach may be advantageous in view of positioning the process of defining the actual work functions at a late manufacturing stage with the potential of reducing overall process fluctuations, sophisticated lithography steps may, however, be required in this manufacturing stage, which may have to be performed on the basis of a pronounced surface topography due to the advanced manufacturing stage, which may contribute to additional transistor variabilities. Moreover, one or more of the associated etch processes, for instance for selectively removing a metal species, removing a photoresist material and the like, may be performed on the basis of a plasma ambient, thereby significantly increasing the probability of damaging the sensitive interface at the high-k dielectric material due to the presence of the metal species. Consequently, the resulting plasma induced etch damage may also result in increased yield loss or at least inferior performance of the resulting semiconductor devices. Furthermore, due to the complex patterning regime on the basis of plasma assisted etch techniques, the configuration of a transition area in gate electrode lines, which may connect a P-type transistor and an N-type transistor, may be difficult to be controlled without introducing additional counter measures, such as the provision of appropriate conductive barrier materials in the form of tantalum nitride and the like. In this case, the barrier layer may be used as an etch stop material during the patterning of a metal species, which, however, may additionally result in overall process complexity and inferior electrical performance of the resulting electrode structures.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to advanced semiconductor devices and methods for forming the same in which gate electrode structures may be formed on the basis of a high-k dielectric material in combination with an appropriate metal-containing electrode material having appropriate work functions for P-channel transistors and N-channel transistors, respectively, wherein the metal-containing electrode material may be provided by replacing a placeholder material, such as a silicon material, after any high temperature treatments and after forming a portion of the interlayer dielectric material, wherein, however, a corresponding lithography regime may be applied in a very early manufacturing stage, thereby avoiding corresponding lithography steps when providing the metal electrode material and adjusting the work function for at least one type of gate electrode structure. Furthermore, in some illustrative aspects disclosed herein, the process sequence for replacing a portion of the gate electrode structures by an appropriate metal species may be performed on the basis of etch techniques without using plasma assisted process atmospheres, thereby significantly reducing the probability of creating plasma-induced damage, in particular at the sensitive high-k dielectric material. To this end, an intermediate liner material may be provided selectively in the gate electrode in one type of transistor which may be accomplished without adding significant process complexity during the gate patterning sequence, while at the same time providing superior process conditions of the corresponding lithography process. Based on the intermediate liner material, the replacement of the place-holder material of the gate electrode structures may be accomplished without requiring additional lithography masks, wherein a common electrode metal may also be used for both types of gate electrode structures, which may also contribute to reduced overall process complexity and superior reliability and which may also provide enhanced controllability for forming a transition area between a P-type gate electrode structure and an N-type gate electrode structure.

One illustrative method disclosed herein comprises forming a first gate electrode structure above a first semiconductor region of a semiconductor device and forming a second gate electrode structure above a second semiconductor region. The first and second gate electrode structures comprise a gate insulation layer including a high-k dielectric material, a metal-containing electrode material and a placeholder material. Furthermore, the first gate electrode structure further comprises an intermediate etch stop liner positioned between the metal-containing electrode material and at least a portion of the placeholder material. The method further comprises removing material of the placeholder material in the first and second gate electrode structures so as to expose the metal-containing electrode material or the high-k dielectric material in the second gate electrode structure and expose the etch stop liner in the first gate electrode structure. Furthermore, the method comprises adjusting a work function in the second gate electrode structure and removing the etch stop liner in the first gate electrode structure. Finally, the method comprises forming a metal-containing material in the first and second gate electrode structures.

A further illustrative method disclosed herein comprises forming a first part of a first gate electrode structure and a second gate electrode structure. The method further comprises selectively forming an intermediate stop liner in the first part of the first gate electrode structure and forming a second part of the first and second gate electrode structures above the first part. Additionally, the method comprises forming a first transistor on the basis of the first gate electrode structure and a second transistor on the basis of the second gate electrode structure. Moreover, a portion of the first and second gate electrode structures is removed in a common etch process while using the etch stop liner as an etch stop material. Additionally, the method comprises adjusting a work function selectively in the second gate electrode structure and removing the etch stop liner in the first gate electrode structure. Finally, a gate metal is formed in the first and second gate electrode structures.

One illustrative semiconductor device disclosed herein comprises a first transistor comprising a first gate electrode structure that comprises a gate insulation layer including a high-k dielectric material and an electrode metal. The semiconductor device further comprises a second transistor comprising a second gate electrode structure that comprises a gate insulation layer including a high-k dielectric material and an electrode metal, wherein the first and second gate electrode structures comprise the same type of high-k dielectric material and the same type of electrode metal.

BRIEF DESCRIPTION OF THE DRAWINGS

The disclosure may be understood by reference to the following description taken in conjunction with the accompanying drawings, in which like reference numerals identify like elements, and in which.

Figure 1A:
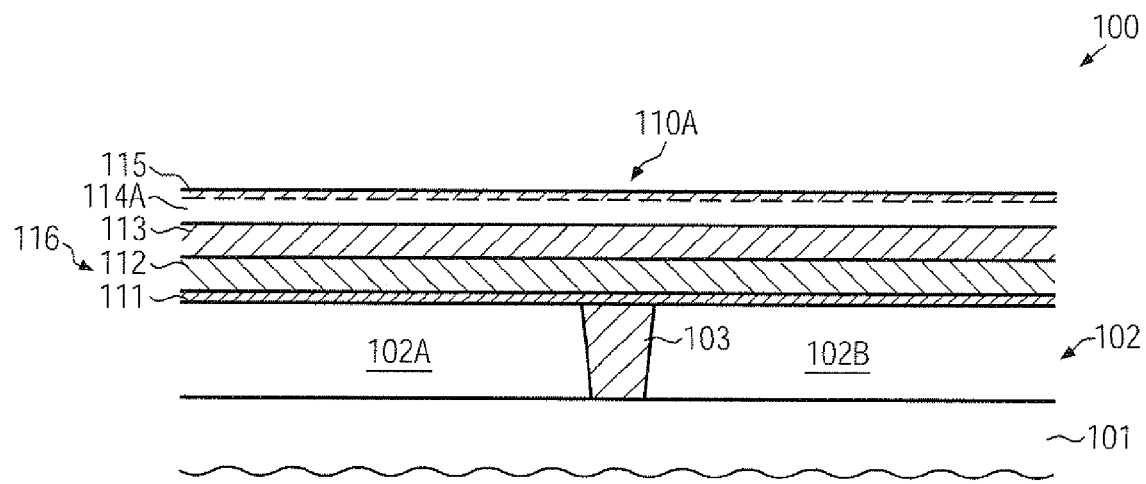
FIGS. 1a-1k schematically illustrate cross-sectional views of a semiconductor device during various manufacturing stages in forming sophisticated gate electrode structures of transistors of different conductivity type on the basis of a replacement gate approach without using a lithography process for adjusting the work function, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein provides semiconductor devices and manufacturing techniques in which a replacement gate approach may be employed in which a lithography process for adjusting the work function of the gate electrode structures of transistors of different conductivity type may be performed in an early manufacturing stage, i.e., during the formation of a gate layer stack, thereby avoiding complex lithography steps during the replacement process sequence. In some illustrative embodiments, the process for replacing standard electrode material by an appropriate metal and adjusting the work function may be performed without requiring plasma assisted etch atmospheres, thereby also reducing the probability of creating plasma-induced etch damage. Hence, by providing an appropriate intermediate liner material, such as a silicon dioxide material, an efficient adjustment of the work function may be accomplished without requiring any masking steps, while, on the other hand, the early patterning of the intermediate liner material may not unduly negatively affect the overall patterning sequence for forming the sophisticated gate electrode structure.

FIG. 1a schematically illustrates a cross-sectional view of a semiconductor device 100 which may comprise a substrate 101 having formed thereabove a semiconductor layer 102. The substrate 101 may represent any carrier material for forming thereabove the semi-conductor layer 102, for instance in the form of a silicon-based semiconductor material, a silicon/germanium material or any other semiconductor compound, as required for forming advanced transistor elements. As previously explained, silicon, possibly in combination with germanium, may represent frequently used semiconductor materials for fabricating advanced complex circuits on the basis of CMOS technologies and, hence, in illustrative embodiments, the semiconductor layer 102 may represent a silicon-containing semiconductor material. Furthermore, the substrate 101 in combination with the semiconductor layer 102 may represent a silicon-on-insulator (SOI) configuration when a buried insulating layer (not shown) is formed between the substrate 101 and the semiconductor layer 102. In other cases, the semi-conductor layer 102 may be formed on a crystalline semiconductor material of the substrate 101, which may be referred to as a "bulk" configuration. It should be noted that an SOI configuration and a bulk configuration may be concurrently used in different areas of the semiconductor device 100, if considered appropriate. Furthermore, an isolation structure 103, such as a shallow trench isolation, may be formed in the semiconductor layer 102 and may delineate corresponding semiconductor regions or active regions 102A, 102B in and above which transistor elements may be formed. For example, the active region 102A may represent a region for forming therein and thereabove an N-channel transistor, while the active region 102B may represent the active region of a P-channel transistor.

Furthermore, in the manufacturing stage shown in FIG. 1a, a first part 110A of a gate layer stack may be formed above the semiconductor regions 102A, 102B. The first part 110A may comprise a gate insulation layer 116 formed on the active regions 102A, 102B which may represent a sophisticated gate dielectric material including a high-k dielectric material 112, possibly in combination with a "conventional" dielectric material 111, such as a silicon dioxide-based material, for instance in the form of a silicon, oxygen, nitrogen-containing compound and the like. The dielectric layer 111 may have a thickness of approximately 1 nm and less and may have any appropriate composition in order to provide desired interface characteristics with respect to the underlying active regions 102A, 102B or to provide stability for the high-k dielectric material 112, depending on the overall process and device requirements. For instance, the high-k dielectric material 112 may be provided in the form of a hafnium-based material, such as hafnium oxide, hafnium silicon oxide and the like, as previously explained. Due to the significantly high dielectric constant of the material 112, the overall thickness of the gate insulation layer 116 may be increased compared to an advanced gate dielectric exclusively formed on the basis of conventional dielectric materials, as previously explained. Moreover, the part 110A of the gate layer stack may comprise a metal-containing electrode material or cap material 113, which may have a desired degree of conductivity and which may provide the desired confinement of the sensitive material 112. Furthermore, the metal-containing material 113 may provide an appropriate work function for one type of transistor still to be formed, for instance for a transistor to be formed in and above the active region 102A. For example, titanium nitride may represent an appropriate material for confining the layer 112 and provide the desired electronic characteristics. Moreover, the part 110A may comprise an intermediate liner material 115, which may also be referred to as a stop liner or etch stop liner, which may be formed, in the embodiment shown, on an optional placeholder material 114A, such as a silicon material, a silicon/germanium material, a germanium material and the like. In other embodiments (not shown in FIG. 1a), the intermediate liner material 115 may be directly formed on the layer 113. In one illustrative embodiment, the intermediate liner material 115 may represent a silicon dioxide material, while, in other cases, other materials may be used that may provide the desired etch stop capabilities in a very advanced manufacturing stage, as will be explained later on. For instance, the liner material 115 may be provided in the form of a silicon oxynitride material, a silicon nitride material and the like. The liner 115 may have a thickness of approximately 10 nm or less in the case of a silicon dioxide material, while, in other cases, any other appropriate thickness value may be selected, depending on the etch stop and diffusion hindering capabilities of the material 115 in a later manufacturing stage.

The semiconductor device 100 as illustrated in FIG. 1a may be formed on the basis of the following processes. After forming the active regions 102A, 102B and the isolation structure 103 by using any appropriate process techniques, the dielectric layer 111 may be formed, for instance, by oxidation and/or deposition, possibly in combination with surface treatments, which may be accomplished on the basis of well-established process techniques. Thereafter, the high-k dielectric material 112 may be deposited, for instance, by chemical vapor deposition (CVD) and the like, wherein a thickness may be adjusted in accordance with device requirements. It should be appreciated that the high-k dielectric layer 112 may be formed directly on the active regions 102A, 102B when direct contact may not negatively affect the overall device performance and the processing of the device 100. Next, the metal-containing material 113 may be deposited, for instance in the form of titanium nitride, using well-established sputter deposition techniques, CVD techniques and the like. Thereafter, if provided, the first portion 114A of the placeholder material, for instance in the form of silicon and the like, may be deposited, followed by the formation of the layer 115, which may be accomplished by oxidation, deposition, a combination of oxidation and deposition, by surface treatment and the like. For example, when providing a placeholder material 114A in the form of a silicon material, well-established oxidation and surface treatment processes may be applied in order to obtain the intermediate liner 115. It should be appreciated that at least the processes for forming the high-k dielectric layer 112 and the metal-containing layer 113 may be performed as in situ processes, i.e., as processes performed in the same deposition chamber or at least in the same process tool without breaking the vacuum between the two deposition steps in order to avoid undue exposure to reactive components, such as oxygen and the like, which may be present in the ambient atmosphere. If desired, the optional layer 114A may also be formed in situ with the layers 112, 113, thereby providing superior integrity of the layer 113.

Figure 1B:
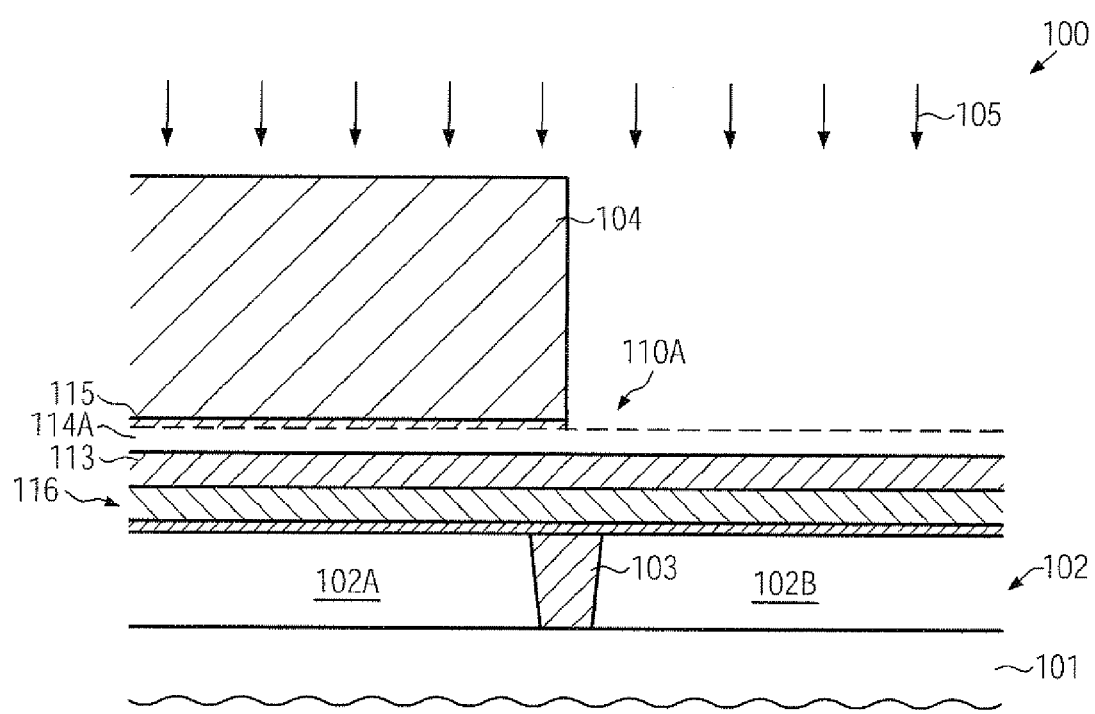

FIG. 1*b* schematically illustrates the semiconductor device 100 in a further advanced manufacturing stage. As illustrated, an etch mask 104, such as a resist mask, may be formed above the part 110A thereby exposing a portion thereof positioned above the active region 102B, while covering the part 110A formed above the active region 102A. Moreover, the device 100 may be exposed to an etch ambient 105 that is configured to remove material of the liner 115 selectively to an underlying material, such as the optional placeholder material 114A, while, in other cases, the etch process 105 may be selective to the layer 113 when the intermediate liner material 115 is directly formed on the layer 113, as previously explained.

The etch mask 104 may be formed on the basis of well-established lithography techniques, wherein superior surface conditions, for instance with respect to overall topography, may be provided since the number of process steps including cleaning steps, etch steps and the like may be moderately low compared to conventional strategies in which a sophisticated patterning process may have to performed in a very advanced manufacturing stage. Moreover, the mask 104, if provided in the form of a resist mask, may be obtained on the basis of a moderately reduced resist thickness, which may be selected on the basis of superior performance during exposure since the etch resistivity of the mask 104 may not have to be very pronounced due to the reduced thickness of the material to be patterned, i.e., of the intermediate liner 115. Consequently, the liner 115 may be provided selectively above the active region 102A with a high degree of accuracy and reliability and may enable the replacement of portions of the respective gate electrode structures in a very advanced manufacturing stage.

Figure 1C:
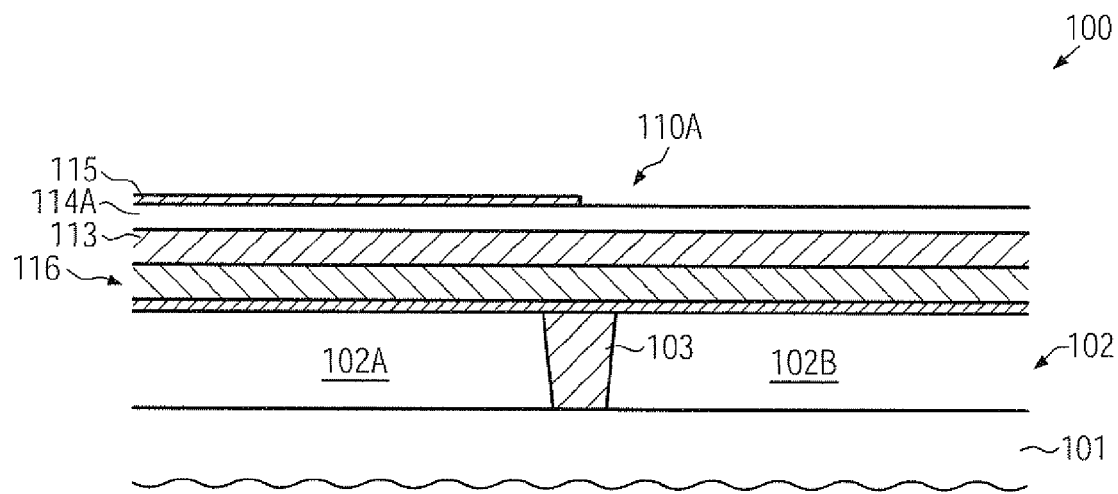

FIG. 1*c* schematically illustrates the semiconductor device 100 after removal of the etch mask 104 shown in FIG. 1*b*, which may be accomplished on the basis of any appropriate etch process, such as a resist removal process and the like. In the embodiment shown, the optional placeholder material 114A may efficiently ensure integrity of the material 113, if exposure to a corresponding process ambient may be considered inappropriate. In other cases, the intermediate liner 115 may directly be formed on the layer 113 which may thus provide for integrity of the sensitive gate insulation layer 116 during a corresponding removal process.

Figure 1D:
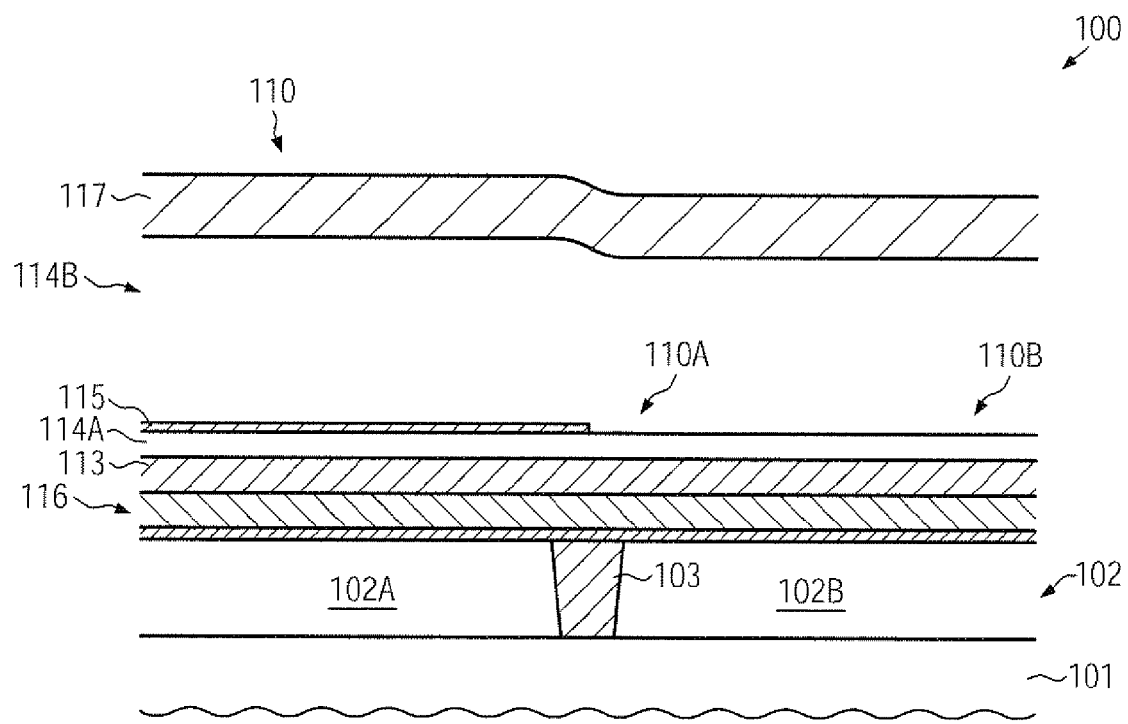

FIG. 1*d* schematically illustrates the semiconductor device 100 in a further advanced manufacturing stage. As shown, a gate layer stack 110 may be provided in which a second part 110B of the layer stack 110 may be formed on the first part 110A, which may comprise the intermediate liner 115 selectively formed above the active region 102A. The second part 110B may comprise a placeholder material 114B, such as a silicon material, a silicon/germanium material and the like, to provide a high degree of compatibility with well-established gate stacks for which appropriate patterning strategies are available. Moreover, the second part 110B may comprise one or more additional materials, such as a cap material, for instance in the form of silicon nitride and the like, possibly in combination with an additional etch stop material, if required, and the like. Moreover, the layer 117 may comprise other materials, such as a hard mask material, for instance in the form of silicon dioxide and the like, in accordance with any desired material system for the subsequent patterning of the gate layer stack 110.

The second part 110B may be formed on the basis of any appropriate deposition processes, such as low pressure CVD for forming an amorphous or polycrystalline silicon material, a silicon/germanium material and the like, followed by the deposition of the layer 117 using any appropriate CVD techniques.

Figure 1E:
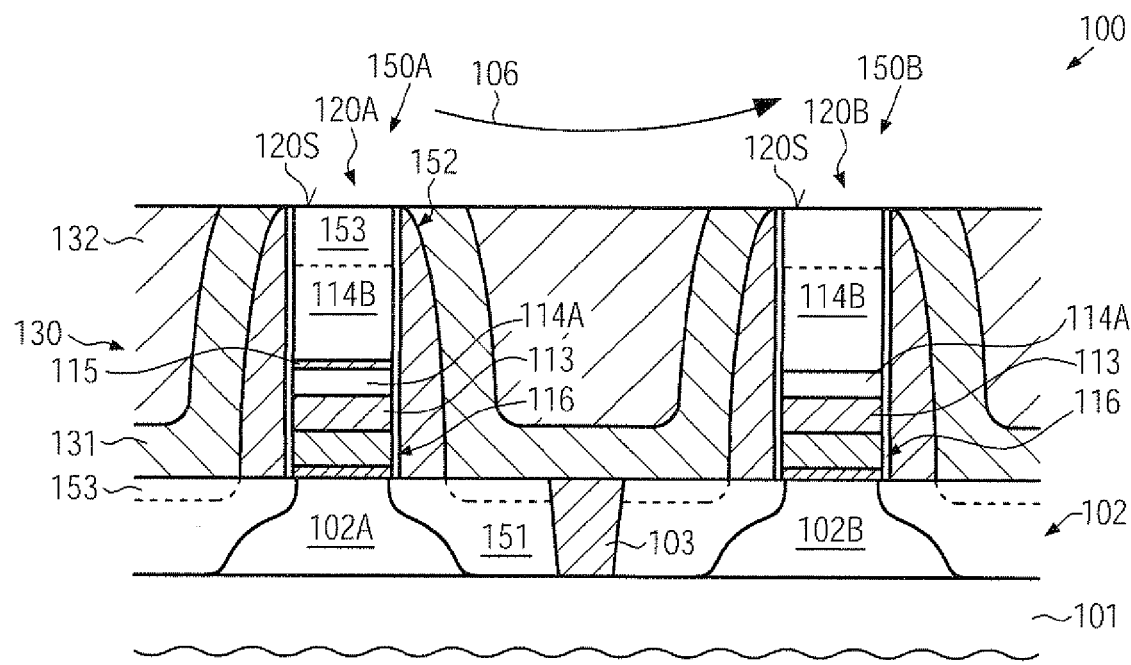

FIG. 1*e* schematically illustrates the semiconductor device 100 in a further advanced manufacturing stage. As illustrated, a first transistor 150A may be formed in and above the active region 102A and may comprise a first gate electrode structure 120A. Similarly, a second transistor 150B may be formed in and above the active region 102B and may comprise a second gate electrode structure 120B. The gate electrode structure 120A may comprise the gate insulation layer 116 having formed thereon the metal-containing material 113 above which may be formed the intermediate liner material 115. In the embodiment shown, the optional placeholder material 114A may be provided between the metal-containing electrode material 113 and the intermediate liner 115. Moreover, the placeholder material 114B may be formed above the liner material 115. It should be appreciated that, depending on the overall process strategy, a metal silicide material 153 may be formed in the placeholder material 114B when comprising a significant amount of silicon.

The second gate electrode structure 120B may comprise the gate insulation layer 116 and the metal-containing electrode material 113 formed thereon, followed by the placeholder material 114A, if provided, and the material 114B.

Moreover, the transistors 150A, 150B may comprise drain and source regions 151, which may include corresponding metal silicide regions 153, for instance in the form of nickel silicide, nickel/platinum silicide and the like. It should be appreciated that the drain and source regions 151 of the transistors 150A, 150B may comprise dopant species of different conductivity type, as may be required for overall performance of the transistors 150A, 150B. Furthermore, the transistors 150A, 150B may comprise additional mechanisms for enhancing overall performance thereof, for instance by providing a strain-inducing material such as a silicon/germanium alloy, a silicon/carbon alloy and the like. For convenience, any such components are not shown in FIG. 1*e*. Moreover, the transistors 150A, 150B may be laterally embedded in an interlayer dielectric material 130, which may comprise two or more different materials, such as a layer 131, which may represent an etch stop layer in a later manufacturing stage when the interlayer dielectric material 130 is to be patterned to provide contact elements connecting to the transistors 150A, 150B. Moreover, a further material 132 may be provided, for instance in the form of silicon dioxide and the like. Depending on the overall process strategy, the transistors 150A, 150B may comprise a spacer structure 152 formed on sidewalls of the gate electrode structures 120A, 120B. The spacer structure 152 may have any appropriate configuration so as to confine the sensitive materials 116 and 113 and to act as an appropriate implantation mask when forming the drain and source regions 151 by ion implantation. Moreover, the spacer structure 152 may be used for forming the metal silicide regions 153, if provided.

The semiconductor device 100 as illustrated in FIG. 1e may be formed on the basis of the following processes. Starting from the gate layer stack 110 (FIG. 1d), an appropriate sequence including a sophisticated lithography process and anisotropic etch techniques may be applied to pattern the gate layer stack in order to obtain the gate electrode structures 120A, 120B. During the patterning of the gate layer stack, the intermediate liner 115 may act as an etch stop material so that, if desired, a different etch chemistry may be used temporarily so as to etch through the material 115 above the active region 102A substantially without significantly affecting the etch process above the active region 102B. Hence, the patterning sequence for forming the gate electrode structures 120A, 120B may be performed with a high degree of compatibility compared to conventional strategies. Thereafter, the further processing may be continued by any appropriate manufacturing strategy, for instance by forming a portion of the spacer structure 152 in order to confine the sensitive materials 116 and 113, for example by forming a silicon nitride spacer element and the like. Thereafter, the drain and source regions 151, for instance extension regions, may be formed, and the final lateral dopant profile may be established on the basis of the spacer structure 152 in accordance with well-established implantation and masking techniques. Thereafter, any high temperature processes may be performed to activate dopants and re-crystallize implantation-induced damage. Hence, the basic transistor configuration may be completed, while, in other cases, the metal silicide regions 153 may be formed in the drain and source regions 151 and possibly in the gate electrode structures 120A, 120B. Next, the interlayer dielectric material 130 may be deposited, for instance by plasma enhanced CVD, sub-atmospheric CVD and the like, depending on the type of material and the characteristics thereof. For example, a portion of the interlayer dielectric material 130, such as the material 131, may be provided with a high internal stress level to enhance performance of one or both of the transistors 150A, 150B. For instance, the layer 131 may be provided with different intrinsic stress levels for the transistors 150A, 150B, which may be accomplished on the basis of well-established deposition and patterning strategies. Thereafter, the material 132 may be deposited, and any excess material may be removed by a process 106, during which surface portions 120S of the gate electrode structures 120A, 120B may be exposed. The removal process 106 may comprise etch steps, a CMP process and the like.

Figure 1F:
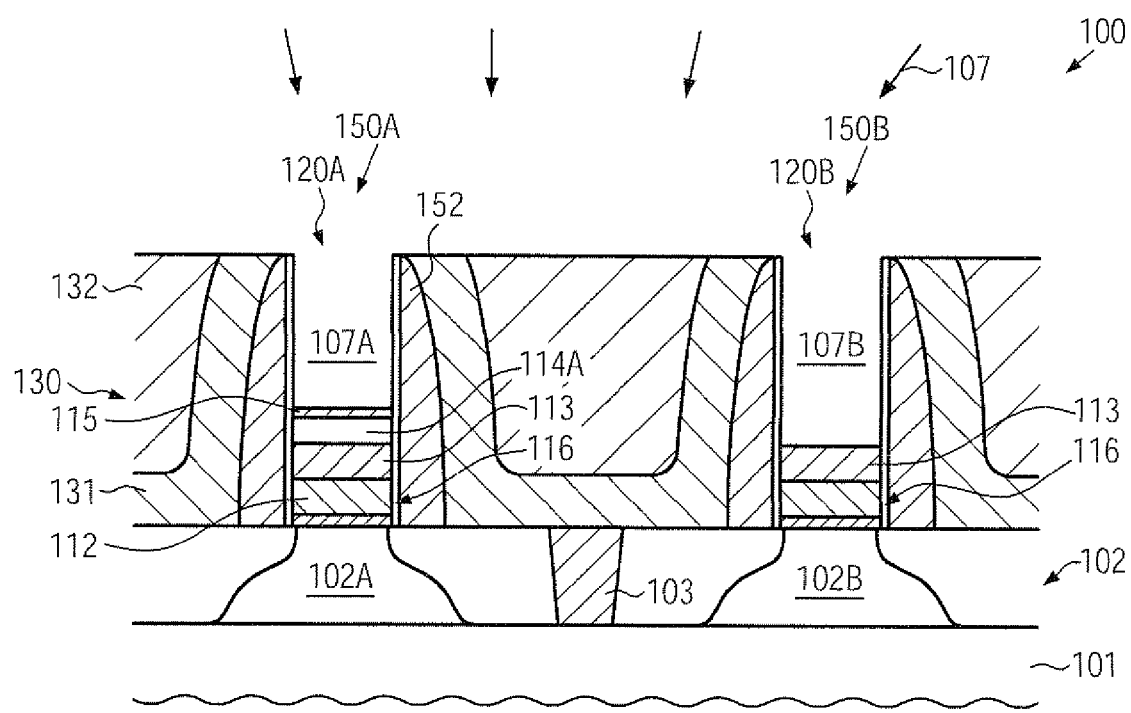

FIG. 1f schematically illustrates the semiconductor device 100 when exposed to an etch ambient 107, which may be designed to remove the place holder material 114B (FIG. 1e), possibly in combination with the material 114A, if provided, selectively to the dielectric materials of the layer 130 and the spacer structure 152. For this purpose, a plurality of wet chemical etch recipes are available, which may remove silicon material selectively to silicon dioxide, silicon nitride and the like. For instance TMAH (tetra methyl ammonium hydroxide) may be used, which represents a chemical agent which may etch silicon at elevated temperatures in the range of approximately 50-80° C. with a high degree of selectivity with respect to silicon dioxide and silicon nitride. Consequently, the material removal may be efficiently stopped at the intermediate liner 115 in the gate electrode structure 120A, thereby forming a corresponding recess 107A therein. On the other hand, the etch process may be stopped in and on the metal-containing material 113 in the gate electrode structure 120B, thereby forming a corresponding recess or trench 107B therein. Thus, the removal of at least a portion of the placeholder materials 114A, 114B may be accomplished without requiring any sophisticated masking regime, while also, in the embodiment illustrated, a plasma-based etch ambient may be avoided.

In some illustrative embodiments, the etch process 107 may comprise a further etch step for removing the exposed metal-containing material 113 in the gate electrode structure 120B, if an electrode metal may be filled in the openings 107A, 107B in a later manufacturing stage and may be appropriate for defining a desired work function for the gate electrode structure 120B. In other cases, the material 113 may be removed in order to enable a direct contact with a further work function adjusting metal species to be deposited in a later manufacturing stage. For removing the material 113, an appropriate chemical agent may be used, for instance an ammonium hydrogen peroxide mixture (APM) at an elevated temperature, which may remove the material 113 selectively to the high-k dielectric material 112. On the other hand, the intermediate liner material 115 may efficiently maintain integrity of the underlying materials in the gate electrode structure 120A.

Figure 1G:
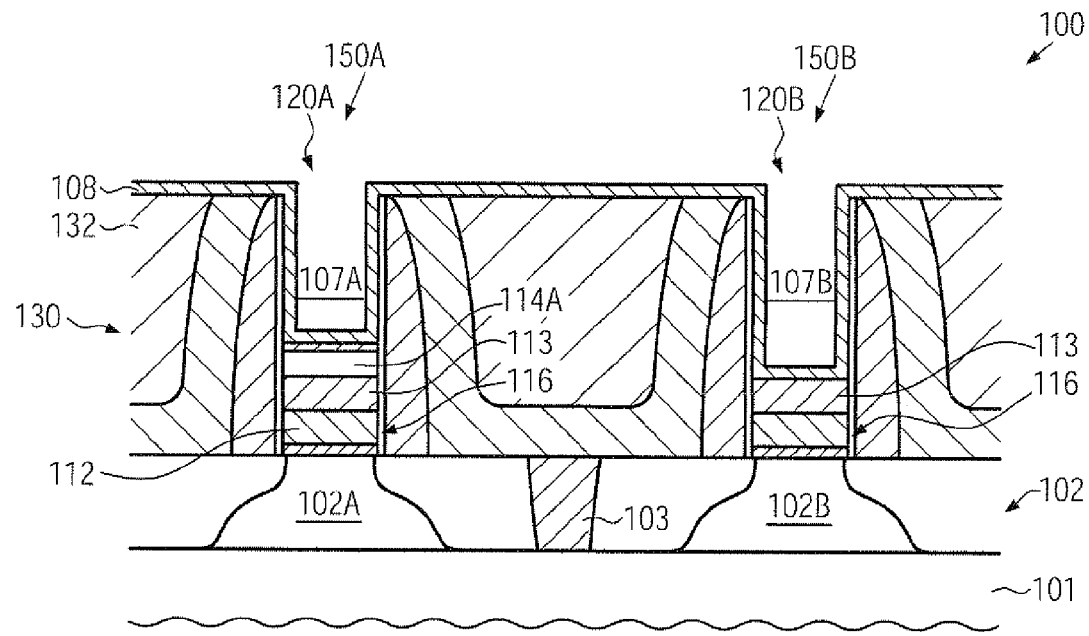

FIG. 1g schematically illustrates the semiconductor device 100 according to further illustrative embodiments in which a metal layer 108 may be formed in the gate electrode structures 120A, 120B in order to adjust the work function in the gate electrode structure 120B. As previously explained, the metal layer 108, which may represent any appropriate material for providing the desired band gap offset, such as lanthanum, aluminum and the like, may be formed on the metal-containing material 113, as illustrated in FIG. 1g, or may be directly formed on the material 112 when a direct contact between the layers 108 and 112 is considered advantageous in view of adjusting the resulting work function. The metal layer 108 may be deposited by any appropriate deposition technique, such as sputter deposition, CVD-type depositions and the like.

It should be appreciated that, in other illustrative embodiments, the deposition of the work function adjusting material 108 may be omitted and an electrode metal may be directly deposited on the exposed high-k dielectric material 112 in a later manufacturing stage.

Figure 1H:
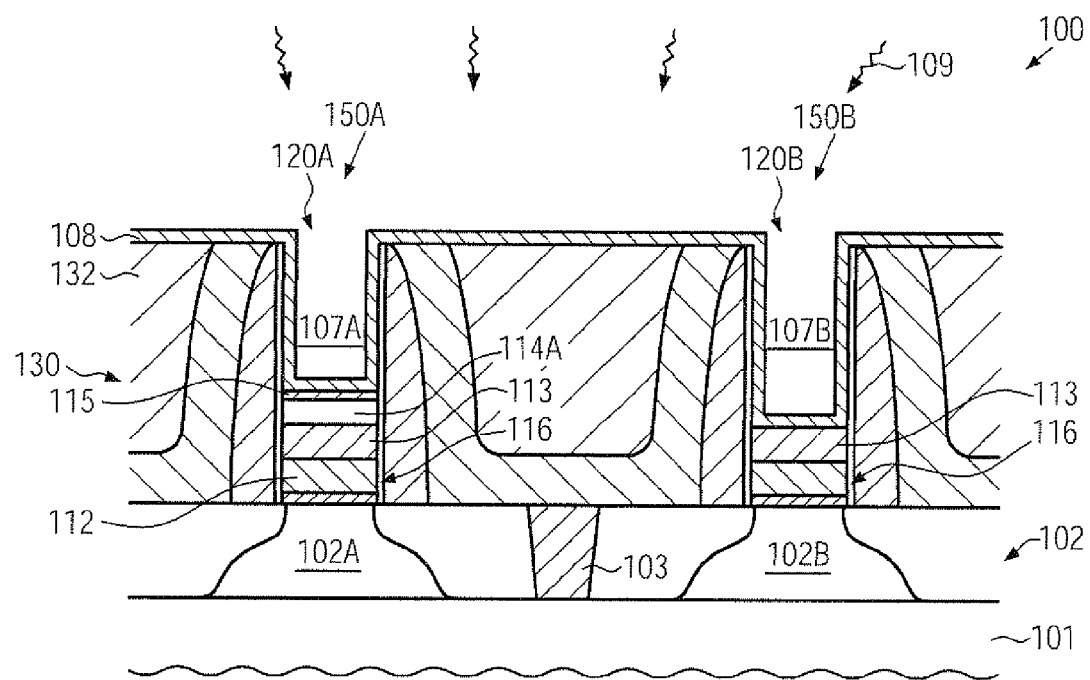

FIG. 1h schematically illustrates the semiconductor device 100 when subjected to a heat treatment 109 in order to initiate diffusion of metal species from the layer 108 into the material 113 and/or the high-k dielectric material 112. For this purpose, any appropriate process technique, such as rapid thermal anneal, oven processes and the like, may be used in combination with an appropriate process temperature that is compatible with the configuration of the semiconductor device 100 and which may result in the desired diffusion of the metal species into the materials 113 and/or 112. For instance, a temperature in the range of 200-500° C. may be applied during the treatment 109. On the other hand, the intermediate liner 115 of the gate electrode structure 120A may act as a diffusion hindering material, wherein also the optional placeholder material 114A may act as an additional buffer material in order to significantly suppress the diffusion of metal species from the layer 108 into the materials 113 and 112. Consequently, the work function defined by the materials 113 and 112 may be substantially maintained, while on the other hand an appropriate adaptation may be achieved in the gate electrode structure 120B, if required. As previously explained, in other illustrative embodiments (not shown), an appropriate metal species may be directly deposited on the layer 112 in a later manufacturing stage.

In the embodiment shown in FIG. 1h, the further processing may be continued on the basis of the material 113 when this layer has not been removed during the preceding processes, as explained above, and the material 112 which may comprise therein a portion 112A (see FIG. 1i) including corresponding metal species which may appropriately adapt the finally obtained work function. Hence, the gate electrode structure 120B may be appropriately prepared for receiving an electrode metal of any appropriate type when the work function may be substantially determined on the basis of the layer 108. In other cases, when a preceding adjustment of the work function using the metal species 108 has been omitted, an appropriate material may have to be deposited directly on the high-k dielectric material 112 so as to obtain the desired work function. For instance, aluminum-based materials may be used for this purpose.

Figure 1I:
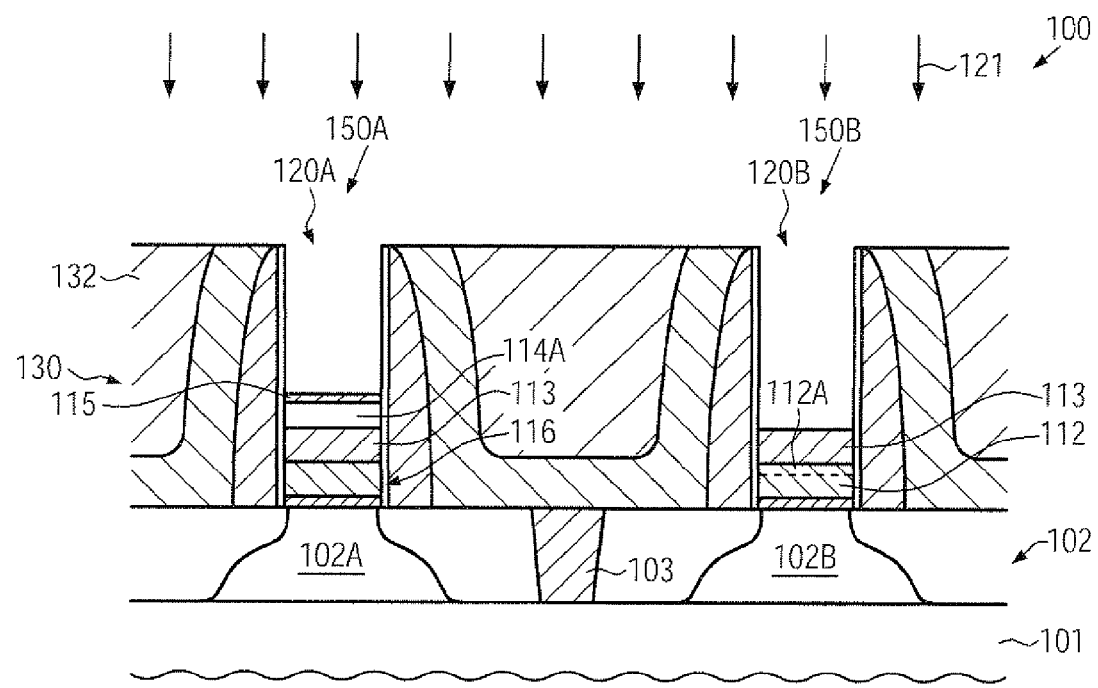

FIG. 1i schematically illustrates the semiconductor device 100 during an etch process 121 which may be performed on the basis of a plasma-less process ambient so as to substantially avoid any plasma-induced etch damage which may be created in conventional strategies, as previously explained. For this purpose, in some illustrative embodiments, the process 121 may be performed on the basis of diluted HCL, which may efficiently remove the material of the layer 108, while essentially not negatively affecting the material 113 if still present in this manufacturing stage. On the other hand, the intermediate liner 115 may maintain integrity of the underlying materials in the gate electrode structure 120A. In still other illustrative embodiments, the etch process 121 may be performed on the basis of hot APM when the removal of the layer 113 may be desired in this manufacturing stage. In this case the interface 112A may be exposed during the etch process 121.

Figure 1J:
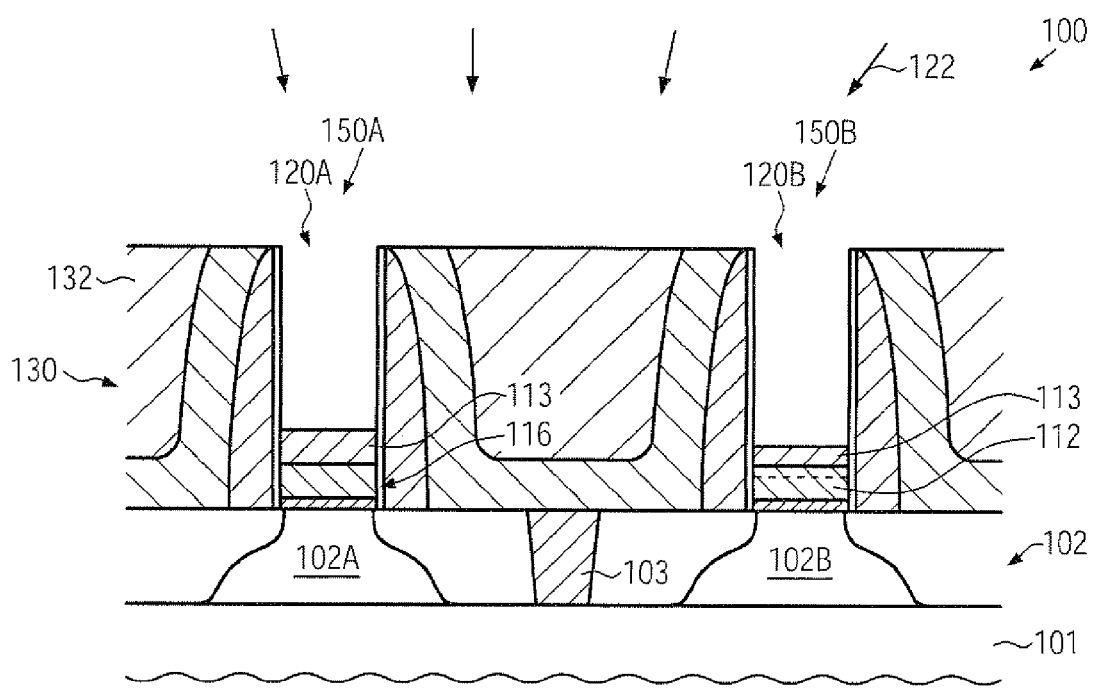

FIG. 1j schematically illustrates the semiconductor device 100 when subjected to a further etch process 122 so as to remove the intermediate liner 115 (FIG. 1i), which may be accomplished for instance on the basis of diluted hydrofluoric acid when the liner 115 is comprised of silicon dioxide. In the gate electrode structure 120B, a portion of the material 113 may be consumed during the process 122, while in other cases the layer 112 may act as an etch stop material if the layer 113 has been removed in one of the preceding manufacturing processes, as previously discussed. Furthermore, in some illustrative embodiments, an additional etch step may be performed in order to remove the material 114A (FIG. 1i), if provided, which may be accomplished by using any appropriate etch chemistry, such as TMAH, thereby exposing the material 113 in the gate electrode structure 120A. Consequently, the gate electrode structures 120A, 120B may be prepared for receiving a common electrode metal, since the work function in the gate electrode structure 120a may be defined by the layer 113, while, in the gate electrode structure 120B, the treated layer 112, possibly in combination with a corresponding residue of the layer 113, may provide a desired work function based on the species of the layer 108 (FIGS. 1g-1h). In other cases, as previously explained, the layer 112 may be exposed and may receive an electrode metal so as to appropriately define the work function in the gate electrode structure 120B, while the material 113 may provide the desired work function in the gate electrode structure 120A.

Figure 1K:
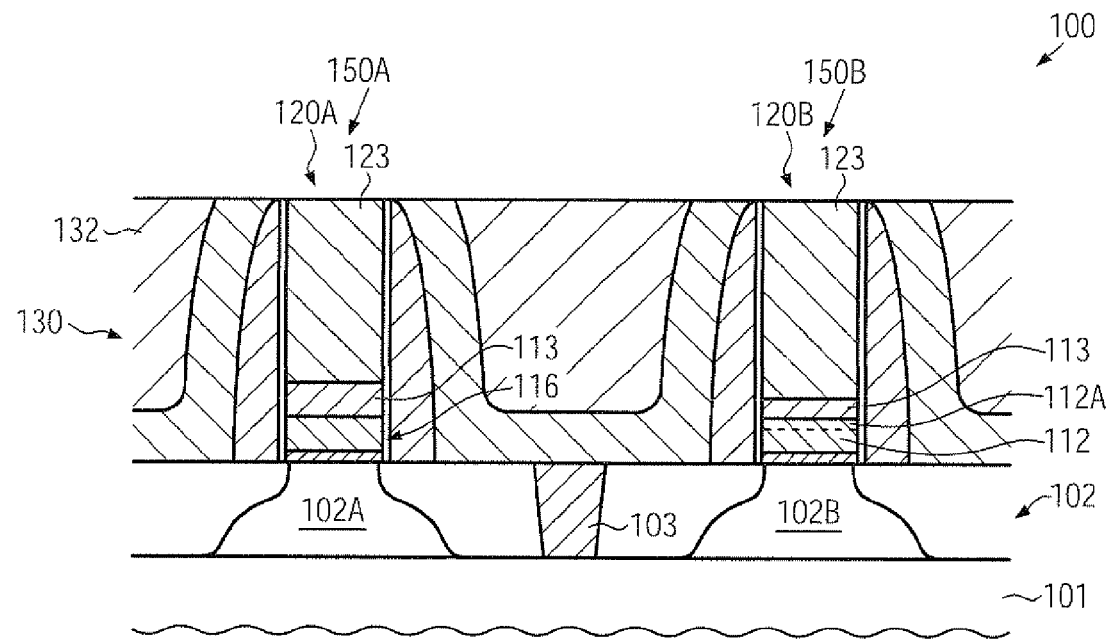

FIG. 1k schematically illustrates the semiconductor device 100 in a further advanced manufacturing stage. As illustrated, the gate electrode structures 120A, 120B may comprise a common electrode metal 123, which may be provided in any appropriate composition. For instance, aluminum-based materials, tungsten, metal silicides and the like may be used as the metal 123 since the work function of the gate electrode structure 120A may be defined on the basis of the material 113, while, in the gate electrode structure 120B, the material 113, if provided, in combination with the interface 112A may provide the desired work function.

The electrode metal 123 may be formed on the basis of any appropriate deposition technique in order to reliably fill the gate electrode structures 120A, 120B, for which well-established deposition recipes are available. Thereafter, any excess material of the electrode metal 123 may be removed, for instance by CMP and the like, thereby providing the device 100 as shown in FIG. 1k. Consequently, the transistors 150A, 150B may comprise the gate electrode structures 120A, 120B having appropriate work functions, wherein the entire patterning sequence may be performed without additional lithography steps and without requiring plasma assisted etch atmospheres. Consequently, the corresponding transistor characteristics may be obtained with a high degree of reliability compared to conventional strategies.

Figure 1L:
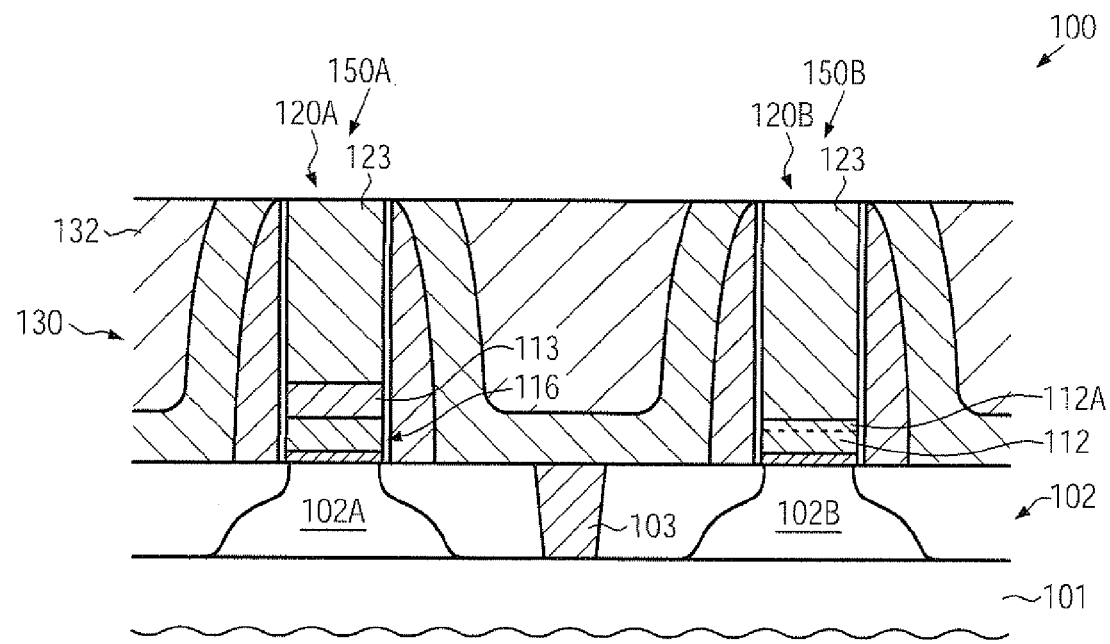
FIG. 1l schematically illustrates a cross-sectional view of the semiconductor device according to further illustrative embodiments in which an electrode metal may be directly formed on a high-k dielectric material in a late manufacturing stage.

FIG. 1l schematically illustrates the semiconductor device 100 according to still further illustrative embodiments in which the common electrode metal 123 may be formed in the gate electrode structure 120B directly on the high-k dielectric material 112. To this end, material 113 may have been removed in any of the preceding manufacturing steps, as previously explained, wherein the interface 112A may provide the desired work function in combination with the metal 123. In still other illustrative embodiments, as previously explained, the metal 123 may be directly formed on the layer 112 without a specific incorporation of a work function adjusting species, i.e., a species defining the interface 112A, when the electrode metal 123 may provide a desired work function in combination with the layer 112 for the transistor 150B.

Consequently, a high degree of flexibility in selecting appropriate work functions may be accomplished while, nevertheless, a single common electrode metal may be used in the gate electrode structures 120A, 120B on the basis of a highly reliable manufacturing sequence without requiring a lithography process in an advanced manufacturing stage of the device 100.

Figure 1M:
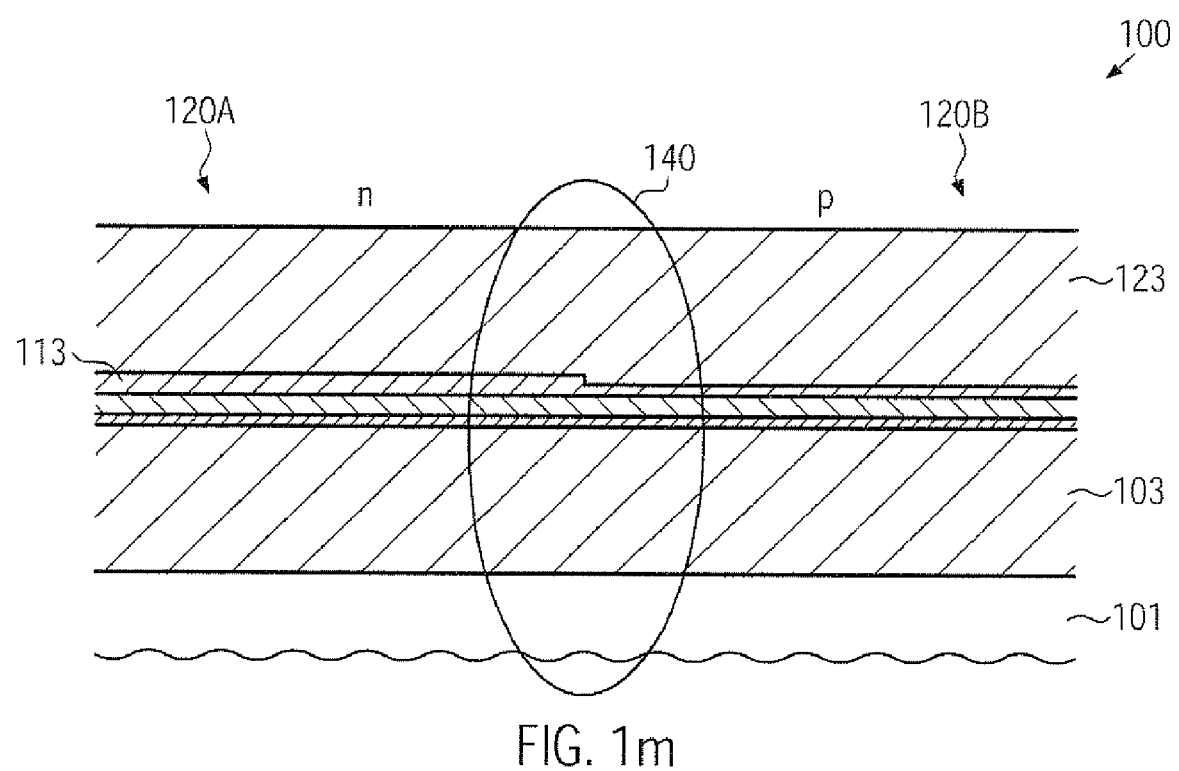
FIG. 1m schematically illustrates a cross-sectional view of a transition area between an N-type and a P-type gate electrode structure, according to still further illustrative embodiments.

FIG. 1m schematically illustrates a cross-sectional view of the semiconductor device 100 in a device region in which gate electrode structures of the transistors of different conductivity type may connect to each other. For convenience, the gate electrode structure 120A and the gate electrode structure 120B are illustrated so as to be connected to each other above a portion of the isolation structure 103. It should be appreciated, however, that this configuration may not be represented in the previous figures in which the gate electrode structures 120A, 120B are positioned side by side. Thus, as illustrated, the gate electrode structures 120A, 120B may connect to each other corresponding to a transition area 140, wherein the common electrode metal 123 may provide a reliable highly conductive connection between the structures 120A, 120B. Since sophisticated patterning strategies for providing electrode metals in an advanced manufacturing stage, as may be typically the case in conventional strategies, are not required according to the principles disclosed herein, enhanced overall controllability of the manufacturing sequence may be accomplished without requiring additional conductive etch stop materials and the like.

As a result, the present disclosure provides semiconductor devices and techniques for forming the same in which a replacement gate approach may be applied on the basis of superior lithography conditions by providing an appropriate intermediate stop liner in one of the gate electrode structures in an early manufacturing stage. Thus, replacing the placeholder material with a common electrode material so that superior process conditions may be obtained since, for instance, any masking steps may be avoided, and also plasma-based etch processes may not be required, provides enhanced overall reliability of the resulting gate electrode structures. Furthermore, the intermediate liner material may enable a high degree of flexibility in adjusting a desired work function for N-channel transistors or P-channel transistors in a later manufacturing stage.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    forming a first gate electrode structure above a first semiconductor region of a semiconductor device and a second gate electrode structure above a second semiconductor region, said first and second gate electrode structures comprising a gate insulation layer including a high-k dielectric material, a metal-containing electrode material and a placeholder material, said first gate electrode structure further comprising an intermediate etch stop liner positioned between said metal-containing electrode material and at least a portion of said placeholder material;
    removing material of said placeholder material in said first and second gate electrode structures to expose one of said metal-containing electrode material and said gate insulation layer in said second gate electrode structure and expose said etch stop liner in said first gate electrode structure;
    adjusting a work function in said second gate electrode structure;
    removing said etch stop liner in said first gate electrode structure; and
    forming a metal-containing material in said first and second gate electrode structures.

2. The method of claim 1, wherein forming said first and second gate electrode structures comprises forming said gate insulation layer, forming said metal-containing electrode material above said gate insulation layer, forming said etch stop liner above said metal-containing electrode material and removing said etch stop liner selectively above said second semiconductor region.

3. The method of claim 2, wherein forming said first and second gate electrode structures further comprises forming a portion of said placeholder material above said metal-containing electrode material prior to forming said etch stop liner.

4. The method of claim 2, wherein said etch stop liner is formed on said metal-containing electrode material.

5. The method of claim 3, further comprising forming another portion of said placeholder material above said etch stop liner.

6. The method of claim 1, wherein adjusting said work function in said second gate electrode structure comprises depositing a metal material and performing a heat treatment so as to diffuse a metal species towards said gate insulation layer of said second gate electrode structure while using said etch stop liner as a diffusion blocking material in said first gate electrode structure.

7. The method of claim 6, further comprising removing said metal material on the basis of a plasma-free removal process.

8. The method of claim 1, further comprising forming drain and source regions in said first and second semiconductor regions and forming at least a portion of an interlayer dielectric material prior to removing material of said placeholder material.

9. The method of claim 1, wherein forming said gate insulation layers comprises forming a silicon dioxide base material and forming said high-k dielectric material on said silicon dioxide base material.

10. The method of claim 1, wherein said etch stop liner is formed on the basis of a silicon dioxide material.

11. The method of claim 10, wherein said etch stop liner has a thickness of approximately 10 nm or less.

12. The method of claim 7, wherein removing said metal material comprises removing said metal-containing electrode material.

13. A method, comprising:
    forming a first part of a first gate electrode structure and a second gate electrode structure;
    selectively forming an intermediate stop liner on said first part of said first gate electrode structure;
    forming a second part of said first and second gate electrode structures above said first part;
    forming a first transistor on the basis of said first gate electrode structure and a second transistor on the basis of said second gate electrode structure;
    removing a portion of said first and second gate electrode structures in a common etch process while using said intermediate stop liner as an etch stop material, said common etch process exposing a high-k dielectric material in said second gate electrode structure;
    removing said intermediate stop liner in said first gate electrode structure; and
    forming a gate metal in said first and second gate electrode structures and using said gate metal to adjust a work function in said second gate electrode.

14. The method of claim 13, wherein said intermediate stop liner is formed so as to comprise a silicon dioxide material.

15. The method of claim 14, wherein said intermediate stop liner is formed with a thickness of approximately 10 nm or less.

16. A method, comprising:
    forming a first part of a first gate electrode structure and a second gate electrode structure;
    selectively forming an intermediate stop liner on said first part of said first gate electrode structure;
    forming a second part of said first and second gate electrode structures above said first part;
    forming a first transistor on the basis of said first gate electrode structure and a second transistor on the basis of said second gate electrode structure;
    removing a portion of said first and second gate electrode structures in a common etch process while using said intermediate stop liner as an etch stop material, said common etch process exposing a metal-containing material in said second gate electrode structure, said metal-containing material being formed on a high-k dielectric material;

after said portions during said common etch process, depositing a work function adjusting metal material in said first and second gate electrode structures;

adjusting a work function in said second gate electrode structure by diffusing a metal species of said work function adjusting metal material towards said high-k dielectric material in said second gate electrode structure while using said intermediate stop liner as a diffusion hindering material in said first gate electrode structure;

removing said intermediate stop liner in said first gate electrode structure; and forming a gate metal in said first and second gate electrode structures.

17. The method of claim 16, wherein said intermediate stop liner is formed so as to comprise a silicon dioxide material.

18. The method of claim 17, wherein said intermediate stop liner is formed with a thickness of approximately 10 nm or less.

19. The method of claim 16, further comprising removing said work function adjusting metal material while using said intermediate stop liner as an etch mask in said first gate electrode structure.

20. The method of claim 19, further comprising removing said metal-containing material in said second gate electrode structure to expose said high-k dielectric material.

* * * * *